United States Patent [19]

Vig

[11] Patent Number: 4,761,298

[45] Date of Patent: Aug. 2, 1988

[54] METHOD OF PRECISELY ADJUSTING THE FREQUENCY OF A PIEZOELECTRIC RESONATOR

[75] Inventor: John R. Vig, Colts Neck, N.J.

[73] Assignee: The United States of America as represented by the Secretary of the Army, Washington, D.C.

[21] Appl. No.: 46,347

[22] Filed: May 6, 1987

[51] Int. Cl.$^4$ .............................................. B05D 3/06
[52] U.S. Cl. .................................... 427/10; 29/25.35; 427/38; 427/54.1; 427/100
[58] Field of Search ..................... 427/10, 38, 100, 39, 427/53.1, 54.1; 29/25.35

[56] References Cited

U.S. PATENT DOCUMENTS

| | | |
|---|---|---|
| 4,107,349 | 8/1978 | Vig . |
| 4,232,239 | 11/1980 | Dworsky et al. .................... 427/100 |
| 4,252,839 | 2/1981 | Wakasugi ............................ 427/100 |
| 4,396,704 | 8/1983 | Taylor ................................ 427/53.1 |
| 4,414,059 | 11/1983 | Blum et al. ......................... 427/53.1 |
| 4,417,948 | 11/1983 | Mayne-Banton et al. .......... 427/53.1 |
| 4,654,118 | 3/1987 | Staples .............................. 29/25.35 |

OTHER PUBLICATIONS

"An Applied Science Perspective of Langmuir-Blodgett Films", by G. G. Roberts, in Advances in Physics, vol. 34, pp. 475-512, 1985.

"Formation and Properties of Ultra Thin Polyimide Films Through the Langmuir-Blodgett Technique", by Masazaku Uekita, Hiroshi Awaji and Makoto Murata, at the Third International Symposium on Molecular Electronic Devices, Arlington, VA, Oct. 6-8, 1986.

*Primary Examiner*—John H. Newsome
*Attorney, Agent, or Firm*—Sheldon Kanars; Roy E. Gordon

[57] ABSTRACT

The frequency of a piezoelectric resonator is precisely adjusted using monomolecular layer(s) of a thermally stable, low stress, uniform insulating film deposited on the active area of the resonator. The method is particularly suitable for precisely adjusting the frequencies of high frequency (i.e., very thin) resonators, and the frequencies of lateral field resonators, without degrading stability.

11 Claims, No Drawings

METHOD OF PRECISELY ADJUSTING THE FREQUENCY OF A PIEZOELECTRIC RESONATOR

The invention described herein may be manufactured, used, and licensed by or for the Government for governmental purposes without the payment to me of any royalty thereon.

This invention relates to a method of precisely adjusting the frequency of a piezoelectric resonator.

BACKGROUND OF THE INVENTION

Art established techniques such as vacuum deposition, have been used heretofore for adjusting the frequencies of conventional resonators. These techniques are discussed, for example, in U.S. Pat. No. 4,107,349, issued Aug. 15, 1978 to John R. Vig.

A difficulty has arisen however, in that the resonator art in the past several years has been extended to ultra high frequency (UHF) and lateral field (LF) resonators. No satisfactory techniques have existed heretofore for precisely adjusting the frequencies of UHF and LF resonators.

SUMMARY OF THE INVENTION

The general object of this invention is to provide a method of precisely adjusting the frequency of a piezoelectric resonator. A more particular object of the invention is to provide such a method where the piezoelectric resonator is a UHF or LF resonator.

It has now been found that the aforementioned objects can be attained using monomolecular layer(s) of a thermally stable, low stress, uniform insulating film deposited on the active area of the resonator.

More particularly, according to the invention, the frequency of a piezoelectric resonator is precisely adjusted by a method including the steps of:
(A) fabricating the resonator by means of art established techniques,
(B) adjusting the frequency of the resonator with an accuracy that is equivalent to about ±1 atomic layer of quartz,
(C) measuring the frequency of the resonator under a well defined set of experimental conditions,
(D) depositing a monomolecular layer of a thermally stable, low stress, uniform insulating film on the active area of the resonator and outgassing the film thoroughly,
(E) measuring the frequency of the resonator under the same set of experimental conditions as in step (C),
(F) calculating the difference between the frequencies measured in steps (C) and (E) as the size of the step change in frequency for the particular resonator design and insulating film,
(G) deciding on the frequency adjustment tolerance desired and converting that frequency adjustment tolerance to an insulating film area tolerance, and
(H) removing the appropriate fraction of the insulating film area.

In step (A), the resonator is first fabricated by art established techniques including growing a suitable piezoelectric material as for example quartz, sweeping quartz, cutting, lapping, rounding, contouring, chemical etching, cleaning, depositing contacts, preparing an enclosure, mounting, bonding, cleaning, baking, plating, etc.

In step (B), the frequency can be adjusted by art established techniques as for example, by vacuum deposition of a gold or aluminum film with an accuracy that is equivalent to about ±1 atomic layer of quartz. In general, for thickness field resonators, the insulating film can then be less than or about equal to one or two molecular layers. For lateral field resonators, more than a single layer may often be required.

In step (C), the frequency of the resonator is measured under a well defined set of experimental conditions, as for example, conditions of temperature, pressure and load capacitance.

In step (D), a monomolecular layer of a thermally stable, low stress, uniform insulating film is deposited on the active area of the resonator and the film thoroughly outgassed. A convenient method of depositing the film uses the Langmuir-Blodgett (LB) technique. The LB technique can deposit a highly ordered monomolecular layer of the film. Thicker films can be "built" one atomic layer at a time. LB films are prepared by transferring floating organic monolayers onto solid substrates. The preparation, properties and applications of LB films are reviewed in "An Applied Science Perspective of Langmuir-Blodgett Films" by G. G. Roberts, in Advances in Physics, Vol. 34, pp 475–512, 1985. The low thermal stability of conventional LB films have now been overcome with the preparation of polyimide LB films, as is described in the "Formation and Properties of Ultra Thin Polyimide Films Through the Langmuir-Blodgett Technique" by Masazaku Uekita, Hiroshi Awaji and Makoto Murata, at the third International Symposium on Molecular Electronic Devices, Arlington, VA, 6–8 Oct. 1986. A monolayer of polyimide LB film weighs about 0.55 times as much as a monolayer of quartz. Such an LB film can, therefore, be very useful for adjusting the frequency of quartz resonators.

In step (E), the frequency of the resonator is measured under the same set of experimental conditions as in step (C).

In step (F), the difference between the frequencies measured in steps (C) and (E) is calculated as the size of the step change in frequency for the particular resonator design and insulating film. For ultrahigh frequency resonators, stress effects due to the film may need to be considered in the calculation.

In step (G) the frequency adjustment tolerance desired is decided and the frequency adjustment tolerance converted to an insulating film area tolerance.

In step (H) the appropriate fraction of the insulating area is removed. When the film is of an organic material, the appropriate area of the film with short wavelength ultraviolet light in the presence of oxygen, that is, by means of UV/ozone cleaning. The UV/ozone will remove the organic film wherever the resonator surface is exposed to UV/ozone. The UV/ozone treatment will leave behind a clean surface. The portion of the film that is shielded from the UV/ozone will remain on the resonator. For example, the appropriate portion of the resonator surface can be exposed to UV/ozone by means of a UV-opaque non-reflecting mask, for example, one that is made of stainless steel. Another method is to raster a short wavelength UV laser as for example, an excimer laser, until the appropriate portion of the film is removed.

Other methods of removing portions of the film are sputtering, ion bombardment, reactive ion etching, and by means of an electron beam. For example, one can form a precise polyimide pattern on the resonator surfaces by depositing as for example, by an ion beam assisted reaction, thin etch barrier layers from monomer vapors, such as tetravinylsilane, through a self supporting mask, on top of the polyimide films, then use oxygen-reactive ion etching for polyimide patterns development. Other means of forming a precise polyimide pattern include rastering an electron beam or an ion beam in order to remove the appropriate fraction of the polyimide film.

DESCRIPTION OF THE PREFERRED EMBODIMENT

A 100MHz±1 ppm resonator is needed for an oscillator intended for use in a radar system. It is therefore necessary to adjust the frequency of a 100 MHz fundamental mode, AT-cut thickness field resonator to an accuracy of ±1 ppm by means of a polyimide LB film. The approximate frequency change per monolayer of polyimide will be $$\Delta F/f = (1.7 \times 10^{-7}) \, f \, \text{MHz}$$

where f MHz is the frequency in megahertz. Therefore, $\Delta f/f = 17$ ppm at 100 MHz. Therefore, in order to obtain frequency adjustment accuracy of ±1 ppm, the area of the monolayer polyimide film must be controlled with an accuracy of about ±1/17 atomic layer.

The 100 MHz fundamental mode AT-cut resonator is first fabricated by art established techniques. Aluminum electrodes are deposited and the electrode thickness adjusted so that the resonator frequency is as close as possible and above 100 MHz when the resonator is in a vacuum and at its upper turnover temperature which is about 71° C. The measurement is made under well defined conditions of temperature, pressure, and load capacitance. That is, the temperature is 71° C.±2° C., the pressure is below $10^{-6}$ torr, and the load capacitance is 20pf±0.5 pf. The frequency is found to be 100.000864 MHz. Thus, the frequency must be lowered by 864 Hz. The 864 Hz corresponds to 8.64 ppm, or 8.64/17=50.8% of an atomic layer of polyimide LB film. An atomic layer of polyimide LB film is then deposited onto the active area of the resonator; 49.2% of the polyimide LB film deposited is then removed by means of irradiation with short wavelength ozone-generating UV light through a mask that permits the exposure of only 49.2% of the film to the UV/ozone. Subsequent to the UV irradiation, the resonator frequency is found to be 99.999998 MHz.

In the foregoing embodiment, in lieu of the polyimide LB film deposited, other thermally stable films deposited by other techniques could be used.

The method of the invention is applicable to bulk acoustic wave devices, surface acoustic wave devices, shallow bulk acoustic wave devices, and other piezoelectric resonators, delay lines, sensors, transducers, etc.

I wish it to be understood that I do not desire to be limited to the exact details as described for obvious modifications will occur to a person skilled in the art.

What is claimed is:

1. Method of precisely adjusting the frequency of a UHF piezoelectric resonator, said method including the steps of:
   (A) fabricating the resonator by means of art established techniques,
   (B) adjusting the frequency of the resonator with an accuracy that is equivalent to about ±1 atomic layer of quartz,
   (C) measring the frequency of the resonator at a known conditions of temperature, pressure and load capacitance,
   (D) depositing a monomolecular layer of a thermally stable, low stress, uniform insulating polyimide film on the active area of the resonator and outgassing the film thoroughly,
   (E) measuring the frequency of the resonator at the same conditions as in step (C),
   (F) calculating the difference between the frequencies measured in steps (C) and (E) as the size of the step change in frequency for the particular resonator design and insulating film,
   (G) deciding on the frequency adjustment tolerance desired and converting that frequency adjustment tolerance to an insulating film area tolerance, and
   (H) removing the appropriate fraction of the insulating film area.

2. Method according to claim 1 wherein the resonator is a thickness field resonator.

3. Method according to claim 1 wherein the resonator is a lateral field resonator.

4. Method according to claim 1 wherein the polyimide film is deposited by the Langmuir-Blodgett technique.

5. Method according to claim 1 wherein the appropriate fraction of the insulating film area is removed by UV/ozone treatment.

6. Method according to claim 1 wherein the appropriate fraction of the insulating film area is removed by rastering a short wavelength UV laser until the appropriate portion of the film is removed.

7. Method according to claim 1 wherein the appropriate fraction of the insulating film area is removed by rastering an electron beam until the appropriate portion of the film is removed.

8. Method according to claim 1 wherein the appropriate fraction of the insulating film area is removed by sputtering.

9. Method according to claim 1 wherein the appropriate fraction of the insulating film area is removed by ion bombardment.

10. Method according to claim 1 wherein the appropriate fraction of the insulating film area is removed by reactive ion etching.

11. Method of adjusting the frequency of a 100 MHz fundamental mode, AT-cut thickness field resonator to an accuracy of ±1 ppm, said method including steps of:
    (A) fabricating the 100 MHz fundamental mode, AT-cut thickness field resonator by means of art established techniques,
    (B) depositing aluminum electrodes and adjusting the electrode thickness so that the resonator frequency is as close as possible to and above 100 MHz when the resonator is in a vacuum and at its upper turnover temperature of about 71° C.,
    (C) measuring the frequency of the resonator under conditions of a temperature of 71° C.±2° C., a pressure of below $10^{-6}$ torr, and a load capacitance of 20 pf±0.5 pf,
    (D) depositing a monomolecular layer of polyimide film obtained by the Langmuir-Blodgett technique onto the active area of the resonator,
    (E) measuring the frequency of the resonator under the same set of conditions as in step (C), (F) calculating the difference between the frequencies measured in steps (C) and (E) as the size of the step change in frequency for the particular resonator design and polyimide film, (G) deciding on the frequency adjustment tolerance desired and converting that frequency adjustment to a polyimide film area tolerance, and (H) removing the appropriate fraction of the polyimide film area by means of irradiation with short wavelength ozone-generating ultraviolet light through a mask.

\* \* \* \* \*